US010249740B2

United States Patent
Rachmady et al.

(10) Patent No.: US 10,249,740 B2
(45) Date of Patent: Apr. 2, 2019

(54) GE NANO WIRE TRANSISTOR WITH GAAS AS THE SACRIFICIAL LAYER

(71) Applicant: Intel Corporation, Santa Clara, CA (US)

(72) Inventors: Willy Rachmady, Beaverton, OR (US); Matthew V. Metz, Portland, OR (US); Van H. Le, Portland, OR (US); Jack T. Kavalieros, Portland, OR (US); Sanaz K. Gardner, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/576,666

(22) PCT Filed: Jun. 27, 2015

(86) PCT No.: PCT/US2015/038190
§ 371 (c)(1),
(2) Date: Nov. 22, 2017

(87) PCT Pub. No.: WO2017/003407
PCT Pub. Date: Jan. 5, 2017

(65) Prior Publication Data
US 2018/0138289 A1    May 17, 2018

(51) Int. Cl.
| | |
|---|---|
| H01L 29/66 | (2006.01) |
| H01L 29/423 | (2006.01) |
| H01L 29/775 | (2006.01) |
| H01L 29/06 | (2006.01) |
| H01L 29/16 | (2006.01) |

(Continued)

(52) U.S. Cl.
CPC ...... *H01L 29/6681* (2013.01); *H01L 27/0924* (2013.01); *H01L 29/068* (2013.01);
(Continued)

(58) Field of Classification Search
CPC ............. H01L 29/6681; H01L 27/0924; H01L 21/02603; H01L 21/02532
See application file for complete search history.

(56) References Cited

U.S. PATENT DOCUMENTS 9,343,559 B2 * 5/2016 Glass ............... H01L 29/66545
9,450,046 B2 * 9/2016 Wen .................. H01L 21/02532
(Continued)

FOREIGN PATENT DOCUMENTS

| WO | WO 2011087570 | 7/2011 |
| WO | WO 2014051731 | 4/2014 |

OTHER PUBLICATIONS

International Preliminary Report on Patentability for International Patent Application No. PCT/US2015/038190, dated Jan. 11, 2018, 10 pages.

(Continued)

*Primary Examiner* — Dung A. Le
(74) *Attorney, Agent, or Firm* — Schwabe, Williamson & Wyatt, P.C.

(57) ABSTRACT

An apparatus including a three-dimensional semiconductor body including a channel region and junction regions disposed on opposite sides of the channel region, the three-dimensional semiconductor body including a plurality of nanowires including a germanium material disposed in respective planes separated in the junction regions by a second material, wherein a lattice constant of the second material is similar to a lattice constant of the germanium material; and a gate stack disposed on the channel region, the gate stack including a gate electrode disposed on a gate dielectric. A method of including forming a plurality of nanowires in separate planes on a substrate, each of the plurality of nanowires including a germanium material and separated from an adjacent nanowire by a sacrificial material; disposing a gate stack on the plurality of nanowires in a designated channel region, the gate stack including a dielectric material and a gate electrode.

18 Claims, 9 Drawing Sheets

(51) Int. Cl.
*H01L 27/092* (2006.01)
*H01L 29/08* (2006.01)
*H01L 29/267* (2006.01)
*H01L 29/78* (2006.01)
*H01L 21/02* (2006.01)
*H01L 21/306* (2006.01)
*H01L 29/20* (2006.01)

(52) U.S. Cl.
CPC ...... *H01L 29/0673* (2013.01); *H01L 29/0847* (2013.01); *H01L 29/16* (2013.01); *H01L 29/267* (2013.01); *H01L 29/42392* (2013.01); *H01L 29/6653* (2013.01); *H01L 29/66439* (2013.01); *H01L 29/66545* (2013.01); *H01L 29/66553* (2013.01); *H01L 29/775* (2013.01); *H01L 29/7853* (2013.01); H01L 21/0243 (2013.01); H01L 21/02532 (2013.01); H01L 21/02546 (2013.01); H01L 21/02603 (2013.01); H01L 21/30612 (2013.01); H01L 29/20 (2013.01)

(56) References Cited

U.S. PATENT DOCUMENTS

| | | | |
|---|---|---|---|
| 2008/0191317 A1* | 8/2008 | Cohen | B82Y 10/00 257/618 |
| 2012/0007052 A1 | 1/2012 | Hobbs et al. | |
| 2013/0161756 A1 | 6/2013 | Glass et al. | |
| 2014/0001441 A1 | 1/2014 | Kim et al. | |
| 2014/0091360 A1 | 4/2014 | Pillarisetty et al. | |
| 2014/0131660 A1* | 5/2014 | Cea | H01L 29/42392 257/24 |
| 2014/0175515 A1 | 6/2014 | Then et al. | |
| 2015/0084041 A1 | 3/2015 | Hur et al. | |
| 2015/0126008 A1 | 5/2015 | Paul et al. | |
| 2015/0162403 A1 | 6/2015 | Oxland | |
| 2016/0071845 A1* | 3/2016 | Bentley | H01L 29/7851 257/401 |
| 2018/0122901 A1* | 5/2018 | Kim | H01L 29/66553 |

OTHER PUBLICATIONS

International Search Report and Written Opinion for International Patent Application No. PCT/US2015/038190 dated Mar. 28, 2016, 13 pgs.

H. Föll, University of Kiel (D): III-V Semiconductors, 2.3.1 3,8,11 Feb. 4, 2012 (Feb. 4, 2012), XP955549849, Retrieved from the Internet:URL:https://www.tf.unikiel.de/matwis/amat/semitech_en/kap_2/backbone/r2_3_1.html [retrieved on Jan. 11, 2019].

Search Report for European Patent Application No. 15897298.4, dated Feb. 5, 2019, 6 pgs.

* cited by examiner

GE NANO WIRE TRANSISTOR WITH GAAS AS THE SACRIFICIAL LAYER

CROSS-REFERENCE TO RELATED APPLICATION

This patent application is a U.S. National Phase Application under 35 U.S.C. § 371 of International Application No. PCT/US2015/038190, filed Jun. 27, 2015, entitled "GE NANO WIRE TRANSISTOR WITH GAS AS THE SACRIFICIAL LAYER," which designates the United States of America, the entire disclosure of which is hereby incorporated by reference in its entirety and for all purposes.

TECHNICAL FIELD

Semiconductor devices including non-planar semiconductor devices having channel regions with low band-gap cladding layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed from group III-V compound semiconductor material systems offer exceptionally high carrier mobility in the transistor channels due to low effective mass along with reduced impurity scattering. Group III and group V refer to a location of the elements of the semiconductor material in groups 13-15 of the Periodic Table of the Elements (formerly groups III-V). Such devices provide high drive current performance and appear promising for future low power, high speed logic applications.

DESCRIPTION OF THE EMBODIMENTS

One or more embodiments described herein are directed to a non-planar semiconductor device (a three-dimensional device) including a channel region and junction regions disposed on opposite side of the channel region. The channel region includes multiple nanowires or nanoribbons including germanium material. In one such embodiment, a gate stack of the device surrounds the channel region in a gate all around configuration.

One of the main issues facing integration of different epitaxial materials (such as III-V compound materials or germanium (Ge)) in the transistor channel is lattice mismatch between those materials and silicon, and an ability to inhibit defect formation during an epitaxial process. In one embodiment, the nanowires or nanoribbons including germanium material are epitaxially formed on a material having a lattice structure similar to germanium. An example of such a material is a group III-V compound material, such as gallium arsenide.

FIGS. 1-7 describe a process of forming a semiconductor device. In one embodiment, the device is a three-dimensional metal oxide semiconductor field effect transistor (MOSFET) and is an isolated device or is one device in a plurality of nested devices. As will be appreciated, for a typical integrated circuit, both N- and P-channel transistors may be fabricated on a single substrate to form a complimentary metal oxide semiconductor (CMOS) integrated circuit. Furthermore, additional interconnects may be fabricated in order to integrate such devices into an integrated circuit.

Figure 1:
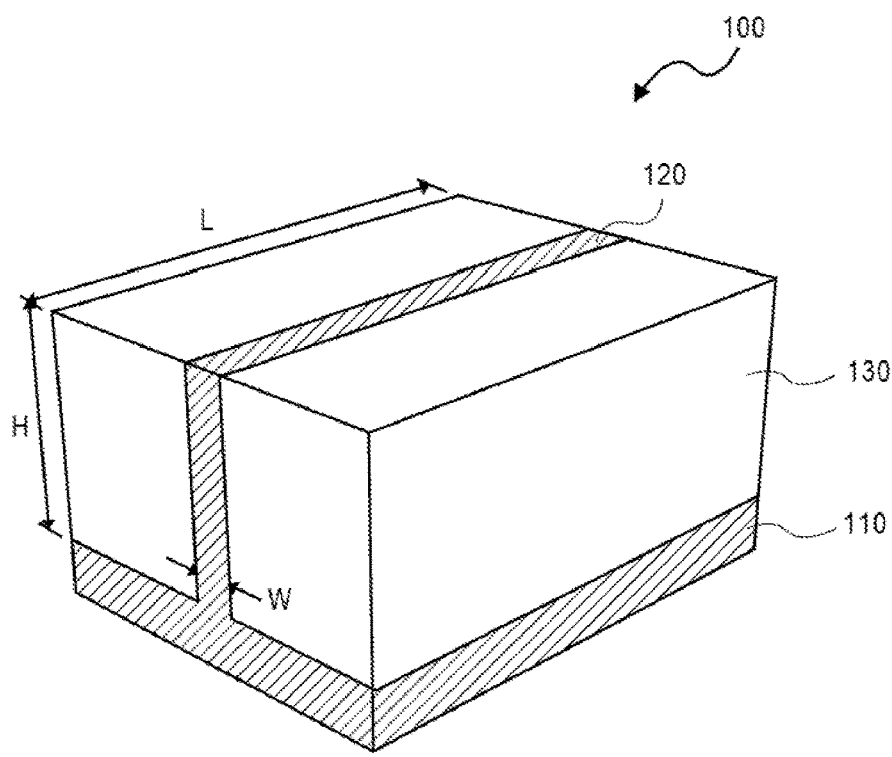
FIG. 1 shows top side perspective view of a portion of a semiconductor substrate, such as a portion of a wafer having a sacrificial fin formed thereon and a dielectric material adjacent the sacrificial fin.

FIG. 1 shows top side perspective view of a portion of a semiconductor substrate, such as a portion of a wafer. Substrate 110, in one embodiment, is silicon. In another embodiment, substrate 110 is a silicon on insulator substrate. On a surface of substrate 110 (a superior surface as viewed), in one embodiment, is an optional buffer layer of silicon germanium introduced by an epitaxial growth technique. Substrate 110 can thus be understood to include in certain instances a buffer layer. Overlying substrate 110, FIG. 1 shows sacrificial fin 120 having a desired length, L, height, H and width, W, dimension for a desired nanowire or desired nanoribbon nanowire three-dimensional circuit device. In one embodiment, sacrificial fin 120 is a single crystal silicon material, such as a material of substrate 110. In one embodiment, sacrificial fin 120 is formed by etching substrate 110 to a depth equal to the desired height, H, of the sacrificial fin. Following the formation of sacrificial fin 120, in the embodiment shown in FIG. 1, a dielectric material 130 is introduced around the fin (e.g., on opposing sides of sacrificial fin 120). In one embodiment, dielectric material 130 is an oxide material.

Figure 2:
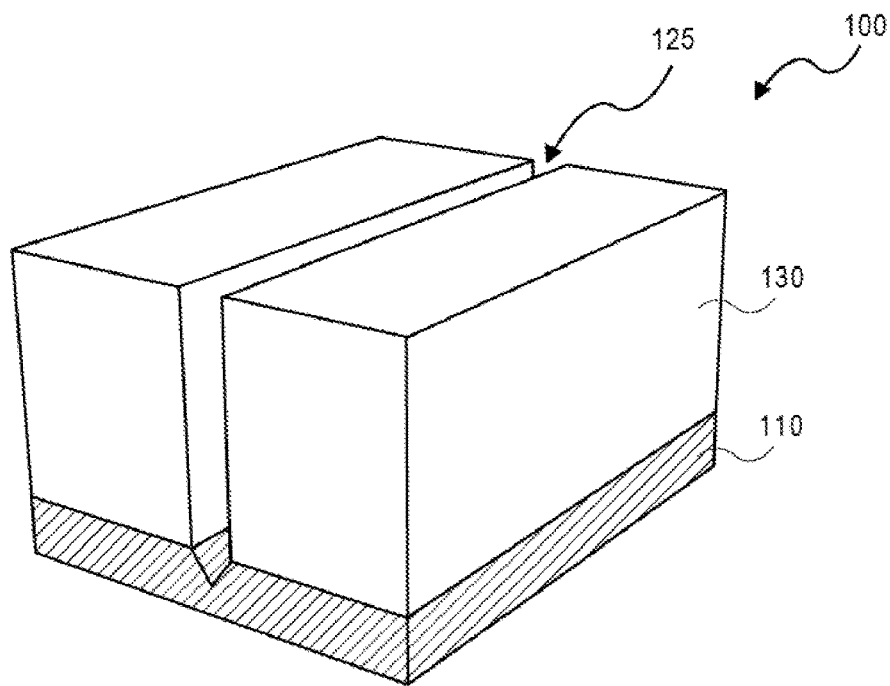
FIG. 2 shows the structure of FIG. 1 following the removal of a sacrificial fin to form a trench in the dielectric material.

FIG. 2 shows the structure of FIG. 1 following the removal of sacrificial fin 120 to form trench 125 in dielectric material 130. Sacrificial fin 120 may be removed by a selective etch process.

Figure 3:
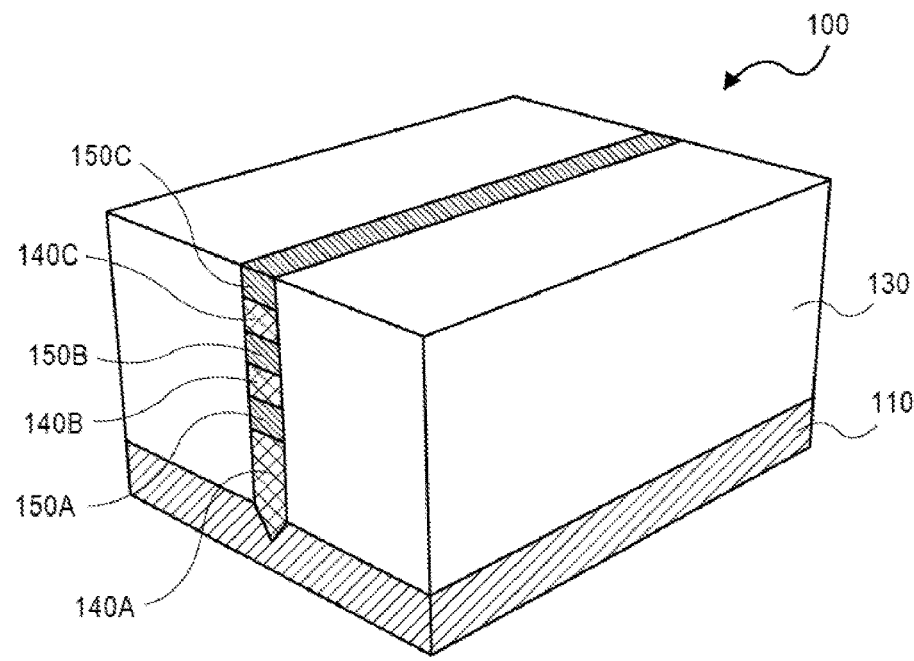
FIG. 3 shows the structure of FIG. 2 following the epitaxial growth of alternative layers of nanowires and a sacrificial material according to an aspect ratio trapping (ART) method.

FIG. 3 shows the structure of FIG. 2 following the epitaxial growth of alternative layers of nanowires and a sacrificial material according to an aspect ratio trapping (ART) method. FIG. 3 shows nanowires 150A, 150B and 150C of a germanium material epitaxially grown on sacrificial layers 140A, 140B and 140C, respectively. The word nanowire as used herein is not limited to any particular shape (e.g., cylindrical, rectangular, etc.) and thus includes nanoribbons and nanostructures of various cross-sectional shapes. In one embodiment, sacrificial layers 140A-C are each a material having a lattice constant similar to a lattice constant of germanium. In one embodiment, sacrificial layers 140A-C are each a group III-V compound structure, such as gallium arsenide (GaAs) epitaxially grown in trench 125. As illustrated in FIG. 3, the epitaxial growth proceeds first with sacrificial layer 140A followed by nanowire 150A, followed by sacrificial layer 140B, nanowire 150B, sacrificial layer 140C and nanowire 150C. Thus, the sacrificial layer and nanowire layer alternate with each nanowire formed on a sacrificial layer. As illustrated in FIG. 3, the alternating layers of sacrificial layers 140A-C and nanowires 150A-C fill trench 125. Although FIGS. 3 and 4 illustrate three nanowires, the structure is not limited to three nanowires and may contain fewer or greater than three nanowires.

Figure 4:
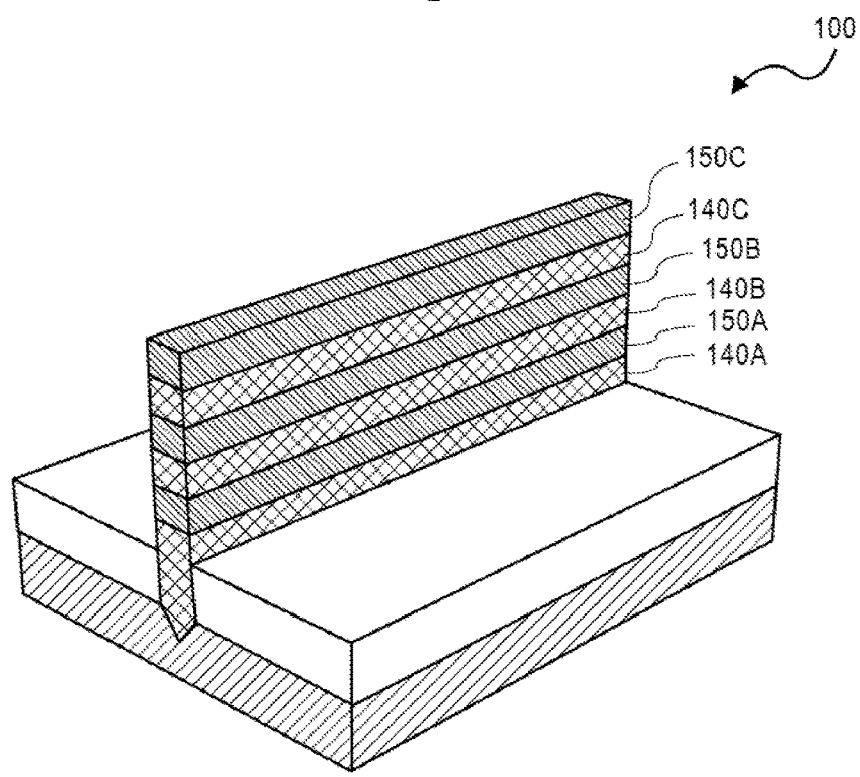
FIG. 4 shows the structure of FIG. 3 following a recess of the dielectric material.

FIG. 4 shows the structure of FIG. 3 following a recess of dielectric material 130. In one embodiment, dielectric material 130 of silicon dioxide is selectively etched as to remove the dielectric material and not remove the layers of nanowire and sacrificial material. As illustrated, the recess proceeds to a level that exposes each of nanowires 150A-C.

Figure 5:
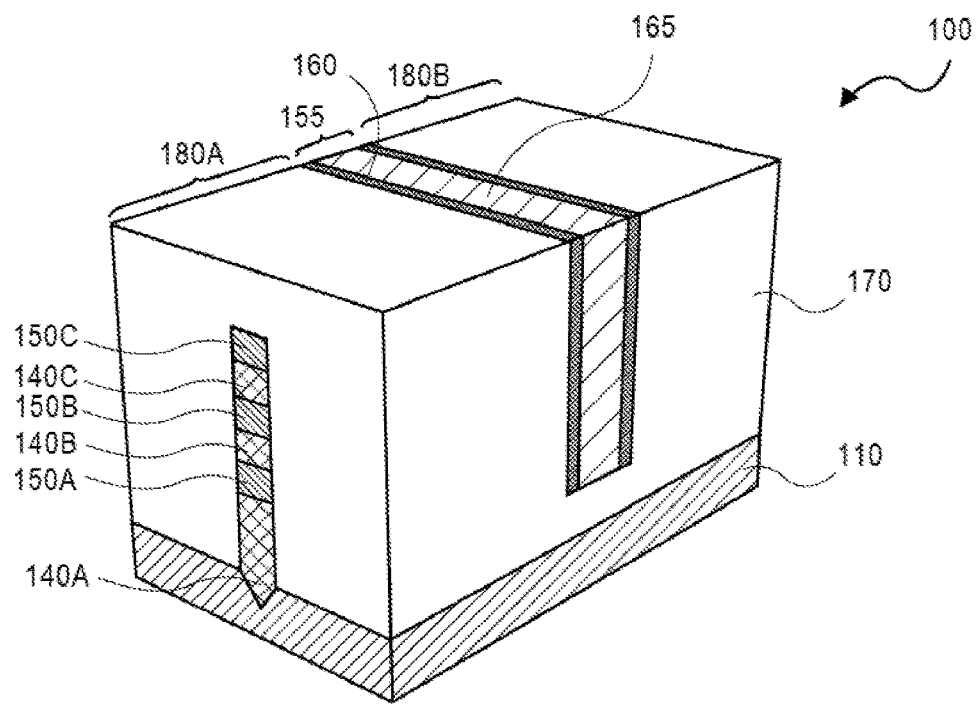
FIG. 5 shows the structure of FIG. 4 following the introduction of spacers and a sacrificial or dummy gate electrode on the nanowire in a designated channel region of the structure and a dielectric material adjacent the spacers with an implementation of a source and a drain of nanowires on sacrificial material.

FIG. 5 shows the structure of FIG. 4 following the introduction of spacers and a sacrificial or dummy gate electrode on the nanowire in a designated channel region of the structure. FIG. 5 shows designated channel region 155, including spacers 160 and sacrificial material 165 deposited between spacers 160. In one embodiment, to form the structure of FIG. 5, a gate dielectric material (e.g., silicon dioxide) is deposited as a blanket on the structure of FIG. 4 followed by a depositing of a sacrificial or dummy gate material (e.g., polycrystalline silicon) also as a blanket on the gate dielectric material. The sacrificial or dummy gate material and gate dielectric material are then patterned to a sacrificial or dummy gate 165 and gate dielectric in designated channel region 155. A spacer material film (e.g., a dielectric material having a dielectric constant less than a dielectric constant of silicon dioxide (a low k dielectric) such as silicon nitride (SiN) or silicon, carbon nitrogen (SiCN)) is then deposited and etched to form spacers 160. Next, a source and a drain are formed in designated junction regions 180A and 180B.

There are different possibilities for source and drain implementation. In one embodiment, nanowires 150A-150C in designated junction regions 180A and 180B may be used as is with sacrificial material 140A-C therebetween. Representatively, nanowires 150A-C may be exposed in designated junction regions 180A and 180B and doped with a suitable dopant followed by a blanket deposition of dielectric material 170 to form ILD0. This implementation is illustrated in FIG. 5.

Figure 6:
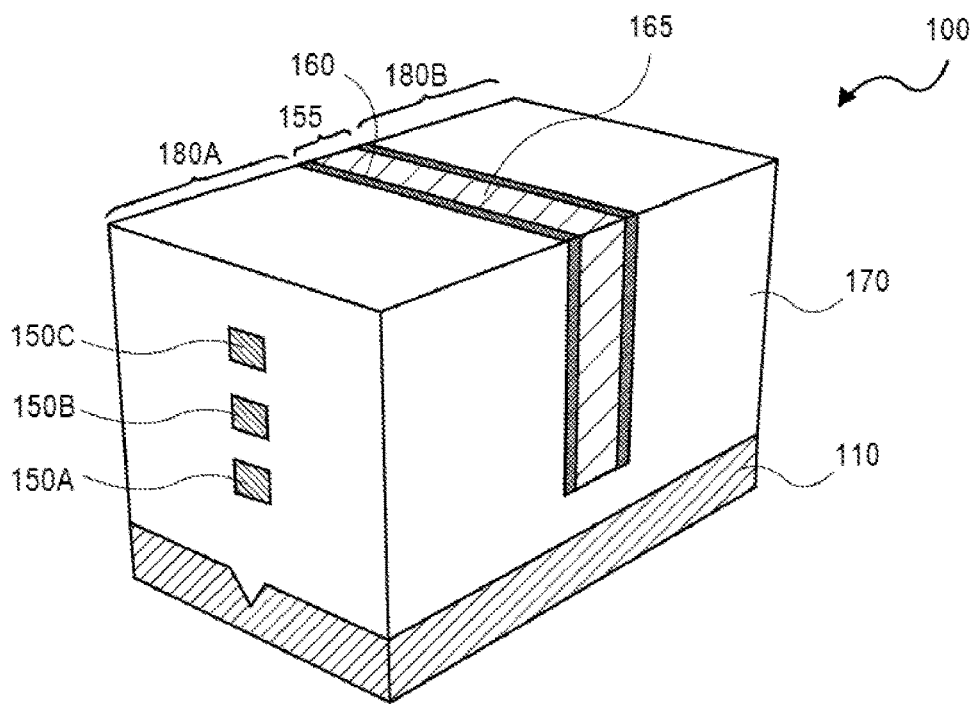
FIG. 6 shows the structure of FIG. 4 following the introduction of spacers and a sacrificial or dummy gate electrode on the nanowire in a designated channel region of the structure and a dielectric material adjacent the spacers with an implementation of a source and a drain as nanowires and the sacrificial material removed in designated junction regions.

In another embodiment, illustrated in FIG. 6, a source and drain implementation involves a removal of sacrificial material 140A-C in designated junction regions 180A and 180B and nanowires 150A-C doped. Representatively, nanowires 150A-C and sacrificial material 140A-C would initially be exposed, then an etch process would follow that removed sacrificial material 140A-C selectively relative to nanowires 150A-C. For a sacrificial material of gallium arsenide, such material may be selectively removed relative to germanium nanowires by a hydrochloric acid-based etch. Nanowires 150A-C could then be doped followed by a blanket deposition of dielectric material 170.

Figure 7:
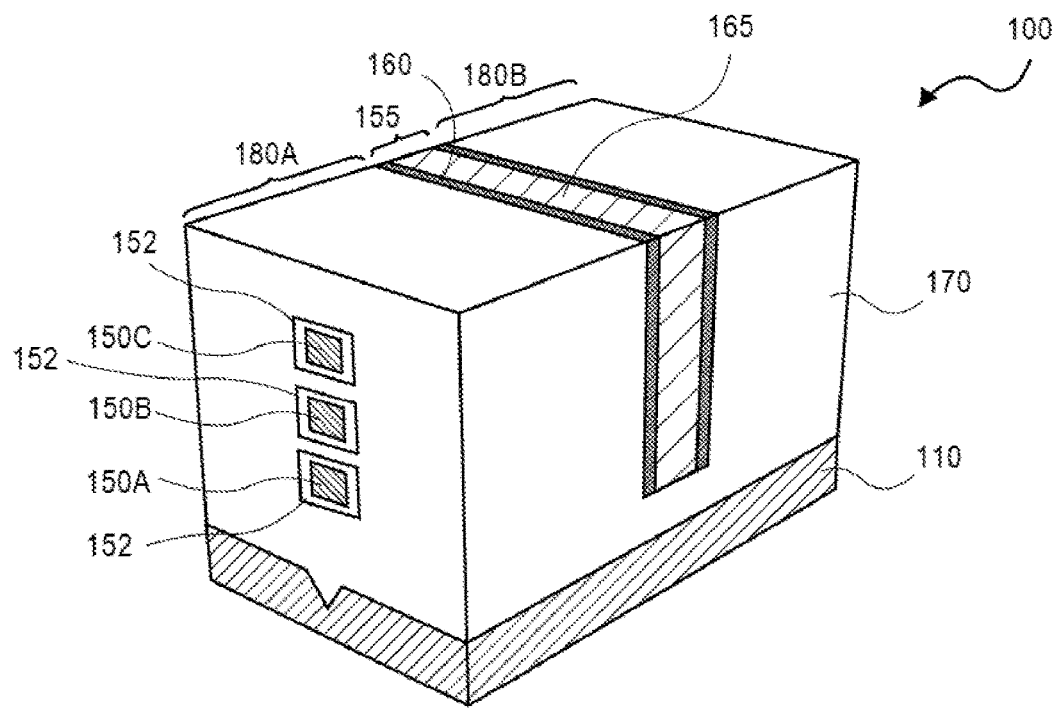
FIG. 7 shows the structure of FIG. 4 following the introduction of spacers and a sacrificial or dummy gate electrode on the nanowire in a designated channel region of the structure and a dielectric material adjacent the spacers with an implementation of a source and a drain as nanowires with a cladding material formed thereon.

In a further embodiment, illustrated in FIG. 7, a source and drain implementation involves a removal of sacrificial material 140A-C in designated junction regions 180A and 180B and an introduction of a cladding material on nanowires 150A-C. Representatively, nanowires 150A-C and sacrificial material 140A-C would be exposed, followed by a selective removal of the sacrificial material as described in the implementation of FIG. 6. Cladding material 152 such as a doped silicon germanium or a doped germanium would then be introduced by way of an epitaxial process around each of nanowires 150A-C. A blanket deposition of dielectric material 170 would follow.

Figure 8:
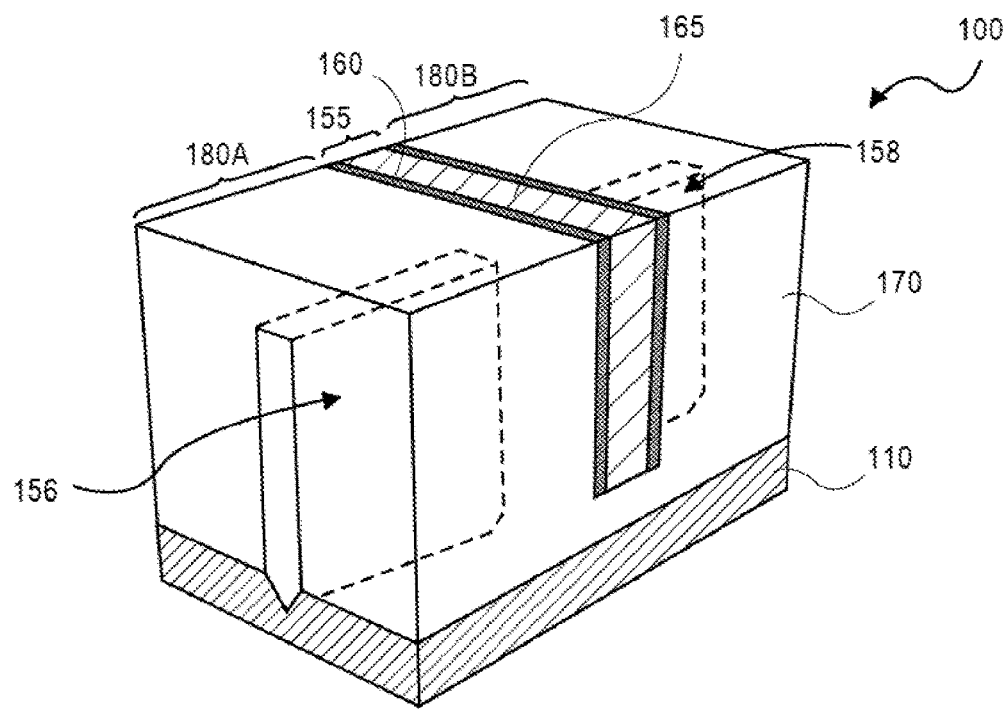
FIG. 8 shows the structure of FIG. 4 following the introduction of spacers and a sacrificial or dummy gate electrode on the nanowire in a designated channel region of the structure and a dielectric material adjacent the spacers with an implementation of a source and a drain as grown or deposited material replacing the nanowires and sacrificial material in designated junction regions.

In a still further embodiment illustrated in FIG. 8, a source and drain implementation involves a removal of nanowires 150A-C and a removal of sacrificial material 140A-C and a replacement of the removed material with source and drain material. Representatively, a dielectric material may be formed in designated junction regions 180A and 180B. Then, a masking and etching process can be used to remove nanowires 150A-C and sacrificial material 140A-C followed by an epitaxial process to introduce source and drain material such as doped silicon germanium or doped germanium or a combination of doped silicon germanium and doped germanium. FIG. 8 shows source 156 and drain 158 formed in designated junction regions in place of nanowires 150A-C and sacrificial material 140A-C.

Each of the implementations of FIGS. 5-8 shows dielectric material 170 of, for example, a silicon dioxide or a low k dielectric material is deposited on designated junction regions 180A and 180B adjacent spacers 160 and the dielectric material polished to expose sacrificial or dummy gate 165.

Figure 9:
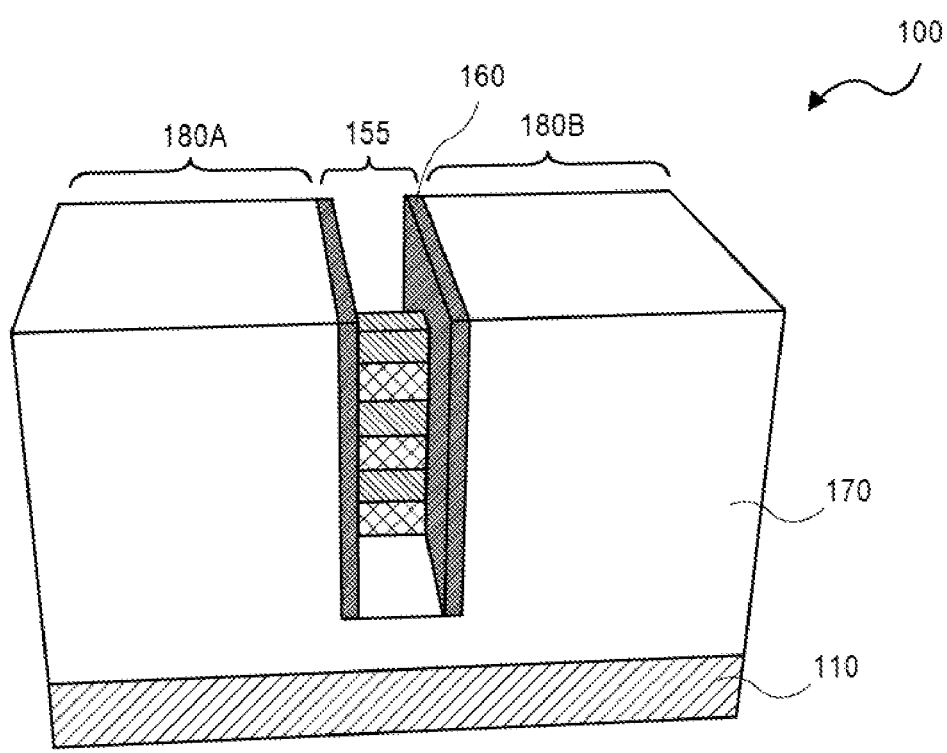
FIG. 9 shows the structure of FIG. 5 following the removal of a sacrificial gate electrode, leaving the spacers adjacent the junction regions.

Using the source and drain implementation illustrated in FIG. 5, FIG. 9 shows the structure of FIG. 5 following the removal of sacrificial gate electrode 165, leaving spacers 160 adjacent junction region 180A and junction 180B, respectively, and defining gate electrode region or channel region 155. In one embodiment, a dummy gate of, e.g., polycrystalline silicone, is removed by a selective etch process.

Figure 10:
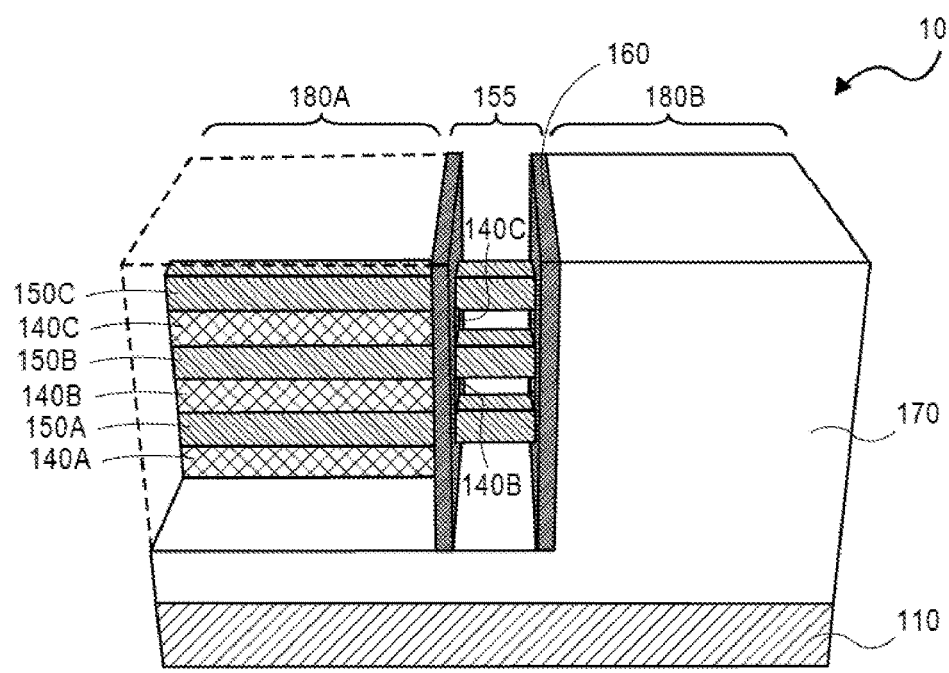
FIG. 10 shows the structure of FIG. 9 following a removal of sacrificial layer material in the channel region.

FIG. 10 shows the structure of FIG. 9 following a removal of sacrificial layer material in channel region 155. In one embodiment, for a sacrificial layer material of gallium arsenide, such material may be selectively removed relative to germanium nanowires by a hydrochloric acid-based etch. In junction region 180A and junction region 180B, the material of sacrificial layers 140A-140C, if still present, is protected from any etch process by dielectric material 170. FIG. 10 representatively shows dielectric material 170 removed in junction region 180A to illustrate the retention of material of sacrificial layers 140A-140C in the junction regions and the removal of such material in channel region 155. In some embodiments, portions or structures of the sacrificial material may still remain within the spacers 160 after the sacrificial material is etched out of the channel region.

Figure 11:
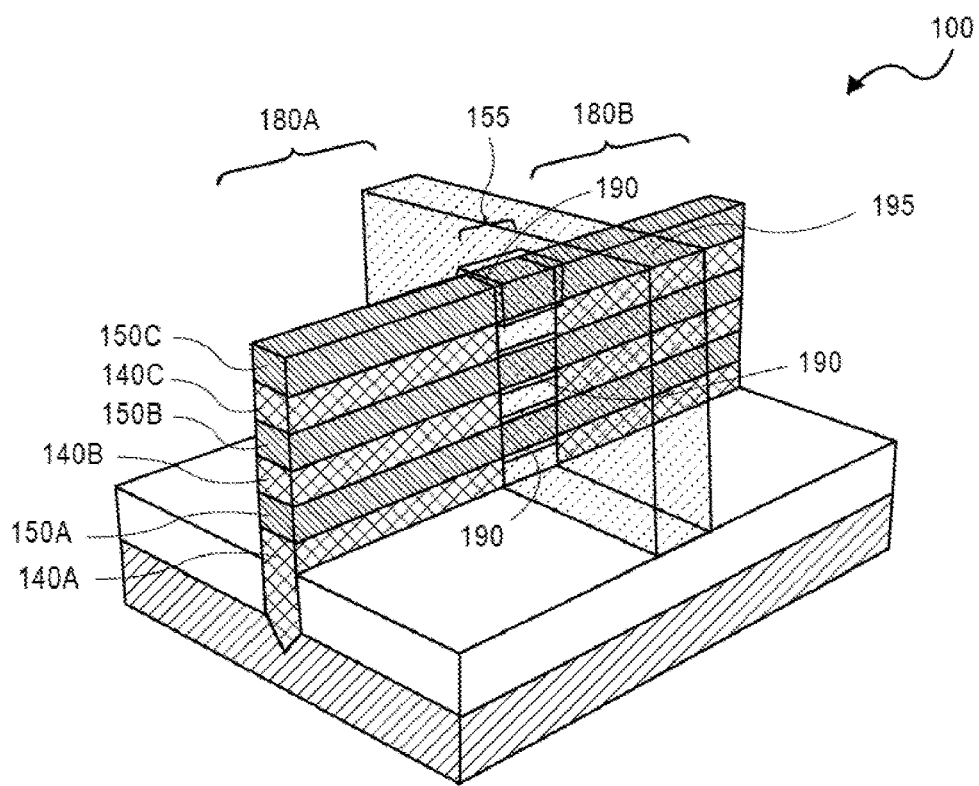
FIG. 11 shows the structure of FIG. 10 following the introduction of a gate stack on the channel region.

FIG. 11 shows the structure of FIG. 10 following the introduction of a gate stack on channel region 155. A gate stack, in one embodiment, includes gate dielectric 190 and gate electrode 195. In one embodiment, gate dielectric 190 is a silicone dioxide or a low-k dielectric material, and gate electrode 195 is a metal material. FIG. 11 illustrates an all-around gate configuration where dielectric layer 190 respectively surrounds each of nanowire 150A, 150B and nanowire 150C, and gate electrode 195 surrounds each gate dielectric. The gate dielectric of a high-k material may be introduced by an atomic layer deposition process, and the gate metal may be introduced by a physical deposition process. Following the formation of the gate stack, contacts may be made to junction regions 180A and 180B, as well as to gate electrode 195 to form electrical connections for device 100. In one embodiment, the three-dimensional nanowire structure including germanium nanowires defines germanium metal oxide semiconductor field effect transistors (MOSFETs) that are suitable for PMOS devices. Such devices may be incorporated in CMOS logic applications together with NMOS devices. The MOSFETs provide minimal short-channel effects as gate length ($L_g$) of a device is scaled downward. The device structure described above enables integration of germanium as PMOS with, for example, silicon or group III-V as NMOS to form CMOS on a wafer (e.g., a silicone wafer) without requiring a wafer-based thick buffer layer. In addition, device drive current can be scaled upward without sacrificing layout density by increasing a number of the germanium nanowires on each device or by increasing a thickness of a wire vertically (e.g., a height dimension of a nanowire).

Figure 12:
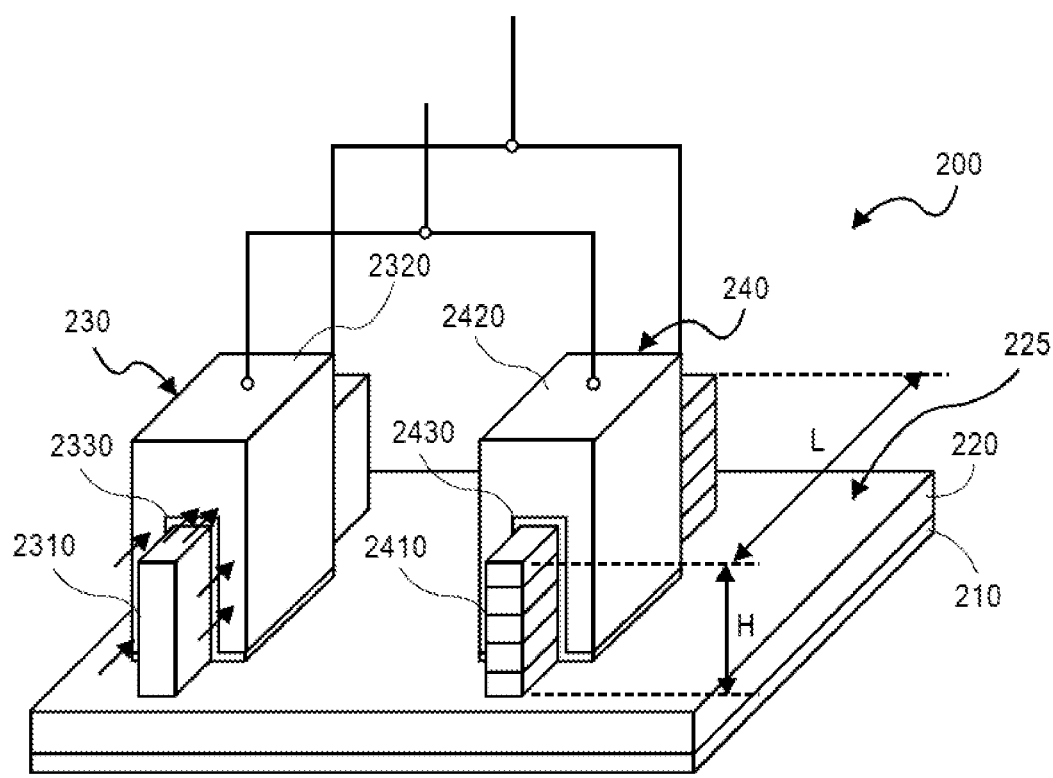
FIG. 12 shows a top front perspective view of an embodiment of a structure including a NMOS device and a PMOS device on a substrate in a CMOS implementation.

FIG. 12 illustrates an embodiment of a portion of a silicon or SOI substrate including non-planar metal oxide semiconductor field effect transistors (MOSFETs). Structure 200 is, for example, a portion of an integrated circuit or chip. Specifically, FIG. 12 shows two multi-gate devices integrated on a substrate for CMOS. It is appreciated that a substrate may contain many more such devices as well as different devices (e.g., planar devices). Referring to FIG. 12, structure 200 includes substrate 210 of silicon or SOI. Overlying silicon substrate 210 is buffer layer 220. In one embodiment, buffer layer 220 is a silicon germanium buffer, such as $Si_{0.3}Ge_{0.7}$ material that is introduced, in one embodiment, on substrate 210 by a growth technique. Buffer layer 220 has a representative thickness of a few hundred nanometers (nm).

In one embodiment, disposed on a surface of buffer layer 220 (as viewed) is n-type transistor device 230 and p-type transistor device 240. N-type transistor device 230 includes fin 2310 is disposed on surface 125 of buffer layer 220. A representation material for fin 2310 is a Group III-V compound semiconductor material such as an indium gallium arsenide (InGaAs) material. In one embodiment, fin 2310 has a length dimension L, greater than a height dimension. A representative length range is on the order of 10 nm to one millimeter (mm) and a representative height range is on the order of five nm to 200 nm. Fin 2310 of n-type transistor of device 230 is a three-dimensional body extending from a surface of buffer layer 220. The three-dimensional body is illustrated in FIG. 12 as a rectangular body but it is appreciated that in the processing of such bodies, a true rectangular form may not be achievable with available tooling and other shapes may result. Representative shapes include, but are not limited to, a trapezoidal shape (e.g., base wider than top and an arch shape).

Overlying fin 2310 is gate dielectric layer 2330 representatively composed of a high-K material such as, but not limited to, aluminum oxide ($Al_2O_3$) or hafnium oxide ($HfO_2$) having a representative thickness in the order of three nm.

Overlying gate dielectric layer 2330 is gate electrode 2320. Gate electrode 2320 is, for example, a metal material such as, but not limited to, a metal nitride, a metal carbide, a metal silicide, hafnium, zirconium, titanium, tantalum, aluminum, ruthenium, palladium, platinum, cobalt, or nickel.

Gate electrode 2320 separates source and drain regions of the device with a channel region disposed in the side beneath the gate. Channel region is disposed in fin 2310 beneath the gate. In this manner, rather than current flowing in a plane underneath the gate as with planar transistor operation, current flows on the top side and opposing side walls of the fin as illustrated.

FIG. 12 also shows p-type transistor device 240 that is, for example, a three-dimensional device formed on a surface of buffer layer 220. P-type transistor device 240 includes fin 2410 illustrated having a rectangular shape. In one embodiment, p-type fin 2410 is a composite structure of alternatively layers of germanium nanowires and sacrificial material in the junction regions of the device as described above with reference to FIGS. 1-11, and nanowires of germanium in a channel region. Surrounding the nanowires in the channel region in a gate all around configuration is gate dielectric layer 2430 representatively of a high-K material such as, but not limited to, $Al_2O_3$ or $HfO_2$ having a representative thickness on the order of 3 nm and gate electrode 2420 of, for example, a metal gate of materials described above.

To indicate a CMOS configuration, the gates and drains of device 230 and device 240 are illustrated as connected.

Figure 13:
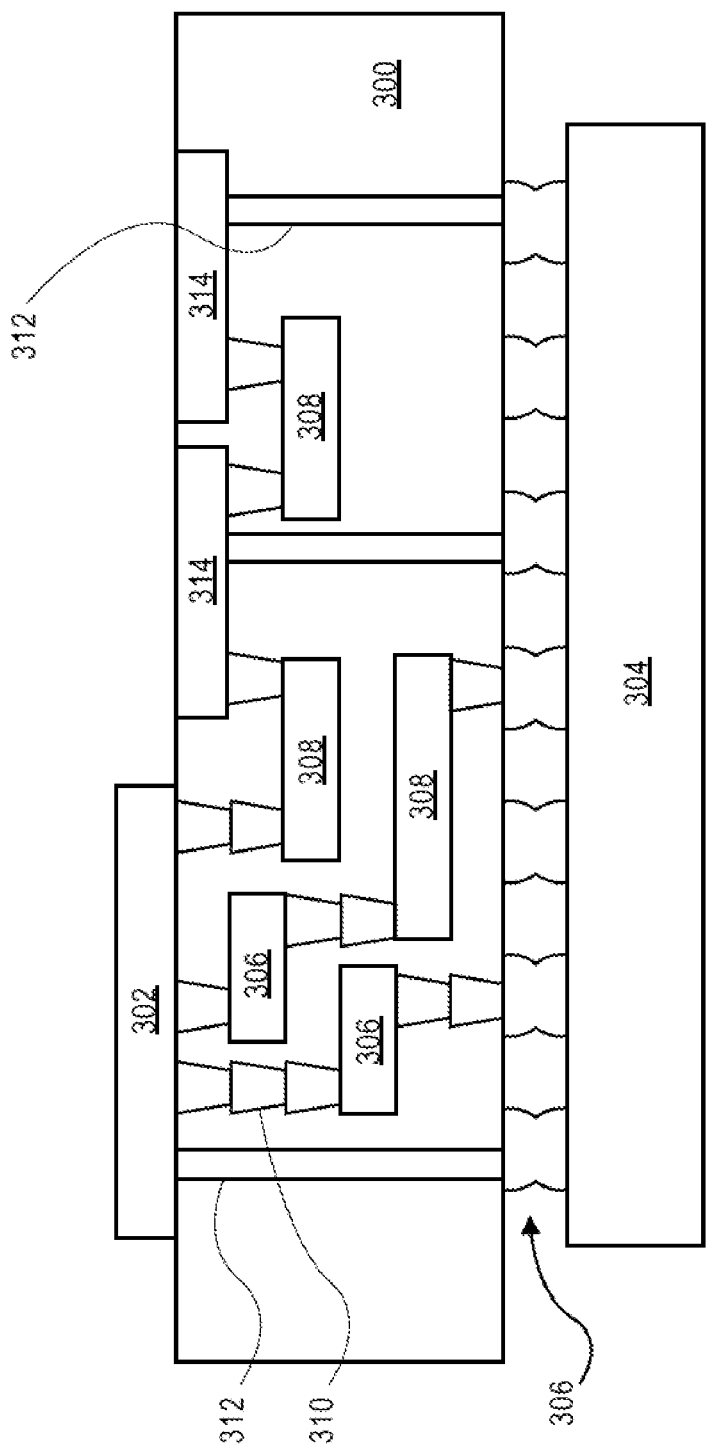
FIG. 13 is an interposer implementing one or more embodiments.

FIG. 13 illustrates an interposer 300 that includes one or more embodiments. The interposer 300 is an intervening substrate used to bridge a first substrate 302 to a second substrate 304. The first substrate 302 may be, for instance, an integrated circuit die. The second substrate 304 may be, for instance, a memory module, a computer motherboard, or another integrated circuit die. Generally, the purpose of an interposer 300 is to spread a connection to a wider pitch or to reroute a connection to a different connection. For example, an interposer 300 may couple an integrated circuit die to a ball grid array (BGA) 306 that can subsequently be coupled to the second substrate 304. In some embodiments, the first and second substrates 302/304 are attached to opposing sides of the interposer 300. In other embodiments, the first and second substrates 302/304 are attached to the same side of the interposer 300. In further embodiments, three or more substrates are interconnected by way of the interposer 300.

The interposer 300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 308 and vias 310, including but not limited to through-silicon vias (TSVs) 312. The interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 300.

In accordance with embodiments, apparatuses or processes disclosed herein may be used in the fabrication of interposer 300.

Figure 14:
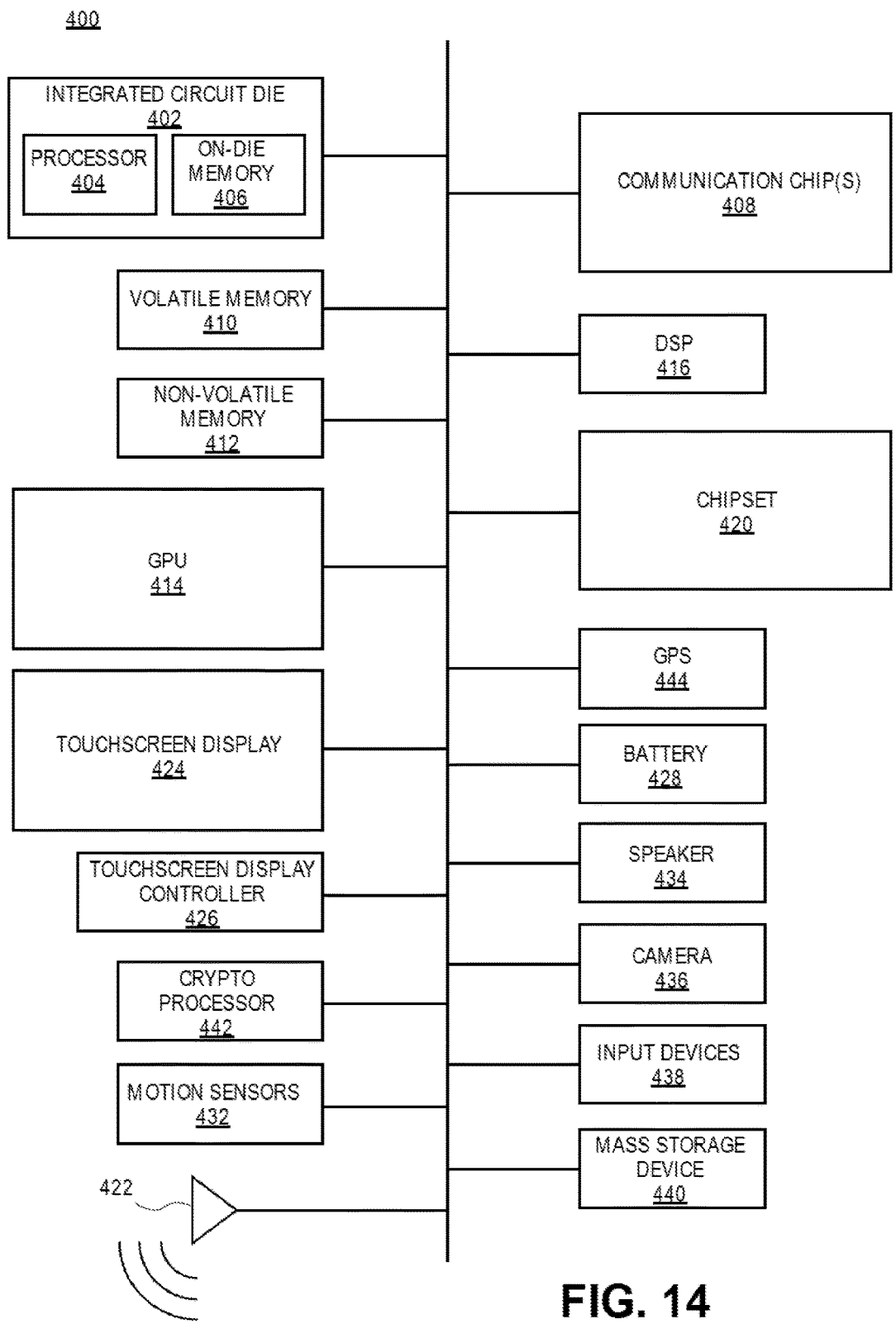
FIG. 14 illustrates an embodiment of a computing device.

FIG. 14 illustrates a computing device 400 in accordance with one embodiment. The computing device 400 may include a number of components. In one embodiment, these components are attached to one or more motherboards. In an alternate embodiment, these components are fabricated onto a single system-on-a-chip (SoC) die rather than a motherboard. The components in the computing device 400 include, but are not limited to, an integrated circuit die 402 and at least one communication chip 408. In some implementations the communication chip 408 is fabricated as part of the integrated circuit die 402. The integrated circuit die 402 may include a CPU 404 as well as on-die memory 406, often used as cache memory, that can be provided by technologies such as embedded DRAM (eDRAM) or spin-transfer torque memory (STTM or STTM-RAM).

Computing device 400 may include other components that may or may not be physically and electrically coupled to the motherboard or fabricated within an SoC die. These other components include, but are not limited to, volatile memory 410 (e.g., DRAM), non-volatile memory 412 (e.g., ROM or flash memory), a graphics processing unit 414 (GPU), a digital signal processor 416, a crypto processor 442 (a specialized processor that executes cryptographic algorithms within hardware), a chipset 420, an antenna 422, a display or a touchscreen display 424, a touchscreen controller 426, a battery 428 or other power source, a power amplifier (not shown), a global positioning system (GPS) device 444, a compass 430, a motion coprocessor or sensors 432 (that may include an accelerometer, a gyroscope, and a compass), a speaker 434, a camera 436, user input devices 438 (such as a keyboard, mouse, stylus, and touchpad), and a mass storage device 440 (such as hard disk drive, compact disk (CD), digital versatile disk (DVD), and so forth).

The communications chip 408 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 408. For instance, a first communication chip 408 may be dedicated to shorter range wireless communications such as Wi-Fi and Bluetooth and a second communication chip 408 may be dedicated to longer range wireless communications such as GPS, EDGE, GPRS, CDMA, WiMAX, LTE, Ev-DO, and others.

The processor 404 of the computing device 400 includes one or more devices, such as the three-dimensional transistors, that are formed in accordance with embodiments described above. The term "processor" may refer to any device or portion of a device that processes electronic data from registers and/or memory to transform that electronic data into other electronic data that may be stored in registers and/or memory.

The communication chip 408 may also include one or more devices, such as transistors or metal interconnects, that are formed in accordance with embodiments described above.

In further embodiments, another component housed within the computing device 400 may contain one or more devices, such as three-dimensional transistors or metal interconnects, that are formed in accordance with implementations described above.

In various embodiments, the computing device 400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

EXAMPLES

The following examples pertain to embodiments.

Example 1 is an apparatus including a three-dimensional semiconductor body including a channel region and junction regions disposed on opposite sides of the channel region, the three-dimensional semiconductor body including a plurality of nanowires including a germanium material disposed in respective planes separated in the junction regions by a second material, wherein a lattice constant of the second material is similar to a lattice constant of the germanium material; and a gate stack disposed on the channel region, the gate stack including a gate electrode disposed on a gate dielectric.

In Example 2, the second material of Example 1 includes a group III and group V compound material.

In Example 3, the second material of Example 1 or Example 2 includes gallium arsenide.

In Example 4, the gate stack of Examples 1-3 surrounds each of the plurality of nanowires in the channel region.

Example 5 is an apparatus including a plurality of nanowires arranged in a stacked arrangement on a substrate, each nanowire including a germanium material; a gate stack surrounding each of the plurality of nanowires, the gate stack including a gate dielectric and a gate electrode; a pair of spacers on opposing sides of the gate stack; a plurality of group III-V material structures confined to an area within the spacers and between the nanowires; and a source region and a drain region each defined on opposite sides of the gate stack.

In Example 6, the plurality of nanowires and the plurality of group III-V material structures extend into the source and drain regions and wherein the group III-V material of Example 5 includes a lattice constant similar to a lattice constant of the germanium material.

In Example 7, the second material of Example 5 of Example 6 includes a group III and group V compound material.

In Example 8, the sacrificial material of Example 5 or Example 6 includes gallium arsenide.

Example 9 is a method including forming a plurality of nanowires in separate planes on a substrate, each of the plurality of nanowires including a germanium material and separated from an adjacent nanowire by a sacrificial material; disposing a gate stack on the plurality of nanowires in a designated channel region, the gate stack including a dielectric material and a gate electrode.

In Example 10, the sacrificial material of Example 9 includes a lattice constant similar to a lattice constant of the germanium material of the plurality of nanowires.

In Example 11, the sacrificial material of Example 9 or Example 10 includes a gallium arsenide.

In Example 12, forming the plurality of nanowires of Example 9 includes epitaxially growing each of the plurality of nanowires on a respective layer of the sacrificial material.

In Example 13, prior to forming the plurality of nanowires, the method of Example 12 includes forming a trench in a dielectric material on a semiconductor substrate and forming the plurality of nanowires includes forming the plurality of nanowires in the trench.

In Example 14, after forming the plurality of nanowires, the method of Example 13 includes removing the dielectric material.

In Example 15, after removing the dielectric material, the method of Example 14 includes forming a sacrificial gate on the plurality of nanowires in the designated channel region; and forming a dielectric material on the plurality of nanowires in areas designated for junction regions.

In Example 16, the method of Example 15 further includes removing the sacrificial gate material.

In Example 17, the method of Example 16 further includes removing the sacrificial material in the designated channel region.

In Example 18, forming the gate stack of Example 17 includes forming the gate stack around each of the plurality of nanowires.

In Example 19, the gate electrode of Example 18 includes a metal material.

In Example 20, the designated channel region of Example 9 or Example 10 is free of the sacrificial material.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made to the invention in light of the above detailed description. The terms used in the following claims should not be construed to limit the invention to the specific implementations disclosed in the specification and the claims. Rather, the scope is to be determined entirely by the following claims, which are to be construed in accordance with established doctrines of claim interpretation.

What is claimed is:

1. An apparatus comprising:
   a three-dimensional semiconductor body comprising a channel region and junction regions disposed on opposite sides of the channel region, the three-dimensional semiconductor body comprising:
   a plurality of nanowires comprising a germanium material disposed in respective planes separated in the junction regions by a second material, wherein a lattice constant of the second material is similar to a lattice constant of the germanium material; and
   a gate stack disposed on the channel region, the gate stack comprising a gate electrode disposed on a gate dielectric.

2. The apparatus of claim 1, wherein the second material comprises a group III and group V compound material.

3. The apparatus of claim 1, wherein the second material comprises gallium arsenide.

4. The apparatus of claim 1, wherein the gate stack surrounds each of the plurality of nanowires in the channel region.

5. An apparatus comprising:
   a fin comprising a plurality of nanowires arranged in a stacked arrangement on a substrate, each nanowire comprising a germanium material;
   a gate stack disposed on a channel region of the fin and surrounding each of the plurality of nanowires, the gate stack comprising a gate dielectric and a gate electrode; and
   a source region and a drain region each defined in the fin on opposite sides of the channel region, wherein the nanowires are arranged in respective planes separated in the source region and the drain region by a sacrificial material comprising a lattice constant similar to a lattice constant of the germanium material.

6. The apparatus of claim 5, wherein the sacrificial material comprises a group III and group V compound material.

7. The apparatus of claim 5, wherein the sacrificial material comprises gallium arsenide.

8. A method comprising:
   forming a plurality of nanowires in separate planes on a substrate, each of the plurality of nanowires comprising a germanium material and separated from an adjacent nanowire by a sacrificial material; disposing a gate stack on the plurality of nanowires in a designated channel region, the gate stack comprising a dielectric material and a gate electrode, wherein the sacrificial material comprises a lattice constant similar to a lattice constant of the germanium material of the plurality of nanowires.

9. The method of claim 8, wherein the sacrificial material comprises a gallium arsenide.

10. The method of claim 8, wherein forming the plurality of nanowires comprises epitaxially growing each of the plurality of nanowires on a respective layer of the sacrificial material.

11. The method of claim 10, wherein prior to forming the plurality of nanowires, the method comprises: forming a trench in a dielectric material on a semiconductor substrate and forming the plurality of nanowires comprises forming the plurality of nanowires in the trench.

12. The method of claim 11, wherein the after forming the plurality of nanowires, the method comprises removing the dielectric material.

13. The method of claim 12, wherein after removing the dielectric material, the method comprises: forming a sacrificial gate on the plurality of nanowires in the designated channel region; and forming a dielectric material on the plurality of nanowires in areas designated for junction regions.

14. The method of claim 13, further comprising removing the sacrificial gate material.

15. The method of claim 14, further comprising removing the sacrificial material in the designated channel region.

16. The method of claim 15, wherein forming the gate stack comprises forming the gate stack around each of the plurality of nanowires.

17. The method of claim 16, wherein the gate electrode comprises a metal material.

18. The method of claim 8, wherein the designated channel region is free of the sacrificial material.

* * * * *